United States Patent [19]

Hwang et al.

[11] Patent Number: 4,638,190

[45] Date of Patent: Jan. 20, 1987

[54] DIGITALLY CONTROLLED WIDEBAND PHASE SHIFTER

[75] Inventors: Ying C. Hwang, Liverpool; Young K. Chen, Syracuse; Louis J. Ragonese, Liverpool, all of N.Y.

[73] Assignee: General Electric Company, Syracuse, N.Y.

[21] Appl. No.: 735,990

[22] Filed: May 20, 1985

[51] Int. Cl.$^4$ ............................................. G01R 25/04
[52] U.S. Cl. ..................................... 307/512; 328/55; 328/155; 307/513; 307/304
[58] Field of Search ............... 307/304, 512, 511, 513; 328/55, 155, 166

[56] References Cited

U.S. PATENT DOCUMENTS

| | | | |
|---|---|---|---|
| 3,921,084 | 11/1975 | Kratt et al. | 307/512 |
| 4,313,089 | 1/1982 | Predina | 328/155 |
| 4,379,264 | 4/1983 | Lenbardt | 307/512 |
| 4,431,969 | 2/1984 | Summers et al. | 328/155 |

Primary Examiner—John S. Heyman
Attorney, Agent, or Firm—Richard V. Lang; Carl W. Baker; Fred Jacob

[57] ABSTRACT

A digitally controlled wideband phase shifter is disclosed in which an input signal is resolved into two quadrature related components, the components are scaled in a stepped digital manner in proportion to the sine and cosine of the phase shifting angle, and then recombined to reconstitute a phase shifted replica of the input signal. The scalers are segmented MESFETS of a dual gate design in which each segment, has a predetermined transconductance and may be gated "ON" or "OFF" by a control signal to affect the overall transconductance of the scaler, and thereby the scaling factor.

The phase shifter is implemented by a monolithic microwave integrated circuit technique in which the preferred substrate material is gallium arsenide, and in which all active device and circuit features are formed on the substrate by a photolithographic process. The phase shifter is adapted to scaling at stepped angles, typically 11¼ or 22½ degrees, is broadband and is applicable to frequencies ranging from a fraction of a gigahertz to many gigahertz.

31 Claims, 10 Drawing Figures

DIGITALLY CONTROLLED WIDEBAND PHASE SHIFTER

CROSS REFERENCE TO RELATED APPLICATION

The present application is related to the copending application of Hwang and Chen entitled SIGNAL SCALING MESFET OF A SEGMENTED DUAL GATE DESIGN, Ser. No. 735,991, filed 5-20-85, assigned to the Assignee of the present application and filed concurrently herewith.

BACKGROUND OF THE INVENTION

1. Field of the Invention

The invention relates to phase shifting means, and more particularly to digitally stepped phase shifting means suitable for operation at frequencies ranging from a fraction of a gigahertz to many gigahertz. Phase shifting finds major application to antenna arrays.

2. Description of the Prior Art

Monolithic microwave integrated circuit (MMIC) technology has proven useful in electronic circuitry operating at frequencies in the gigahertz range. The technology relies largely on the definition of the active and passive components and their interconnections by a precise, and repeatable photolithographic technique on a monolithic substrate. A preferred substrate material is gallium arsenide. Application of the technology results in a compact and electrically efficient design. The circuits and devices fabricated from this material function well at these frequencies and are capable of precise engineering characterization.

Typically, phase shifting is required in the reception or transmission of signals involving antenna arrays, wherein the phase must be adjusted either row by row or element by element. The phase control is used to alter the mode of the array or to steer the beam. The phase adjusting means, depending on the number of rows or elements of the array, must be of such accuracy as to preserve the accuracy inherent in the array itself. In such applications digital control is particularly desirable. In addition, the phase adjusting means should be sufficiently broadband as not to distort the signal, often broadband, being processed.

In the copending application of Messrs Hwang and Chen, a segmented dual gate MESFET for accurate signal scaling has been proposed. The scaler, which is an application of MMIC technology to digital signal scaling has provided a promising first step in achieving wideband digital phase shifting.

SUMMARY OF THE INVENTION

Accordingly, it is an object of the present invention to provide an improved phase shifter applicable to frequencies from a fraction of a gigahertz to many gigahertz.

It is another object of the present invention to provide a phase shifter applicable to gigahertz frequencies having a wideband width.

It is still another object of the present invention to provide a wideband phase shifter applicable to gigahertz frequencies capable of digital control and producing stepped changes in phase.

It is a further object of the invention to provide a wideband digitally stepped phase shifter applicable to gigahertz frequencies, of compact and electrically efficient design.

It is another object of the present invention to provide a wideband digitally stepped phase shifter applicable to gigahertz frequencies suitable for monolithic integrated circuit fabrication.

It is still another object of the present invention to provide a novel combination of segmented dual gate MESFET scalers integrated upon a common substrate and suitable for use at gigahertz frequencies in a broadband digitally stepped phase shifter. These and other objects of the invention are achieved in a novel digitally controlled wideband phase shifter, which is adjustable in selected discrete angular steps. The phase shifter comprises phase splitting means for resolving an input signal to be phase shifted into a first and a second vector component in mutual quadrature, a first and a second dual gate MESFET, each having source, drain, signal gate and n-fold control gate terminals, each MESFET being subdivided into an n-fold plurality of segments. Each MESFET segment has a predetermined width to achieve a desired transconductance, and various combinations of segments are selectively activated by a control signal, to provide successive transfer values (i.e. scaling factors) respectively proportional to the sine and cosine of successive angle thetas, resulting from stepping the phase shifter.

Finally, means are provided for combining the quadrature related, sine and cosine proportioned vector components at the output of the two MESFETS to form an output signal which represents the desired stepped rotation of the input signal by the angle theta.

In accordance with a further aspect of the invention, each MESFET segment has an electroded source region connected to a common MESFET source terminal, an electroded drain region connected to a common MESFET drain terminal, and a gate region defined between source and drain regions having a signal gate electrode for modifying the AC output signal current of the MESFET as a function of the segment transconductance, and an activating gate electrode disposed between the signal gate electrode and the drain for turning current flow "ON" or "OFF" in the MESFET segment.

When the stepped rotation of the phase shifter is in steps equal to 1/16th or 1/32nd of 360° (or 360/n, where $n=2^k$; k being greater than 2), the same design may be used for generating either sine or cosine values. In the case of $22\frac{1}{2}°$ intervals, a six bit control signal and two three segment MESFETS are adequate, with the segment widths being in the proportions of 1:3.613:7.524.

In the case of $11\frac{1}{4}°$ intervals a ten bit control signal and two five segment MESFETS are adequate, with the segment widths being in the proportions of 10, 16, 23, 57 and 122.

The phase shifter, particularly at higher frequencies is preferably fabricated using MMIC (monolithic microwave integrated circuit) techniques on a monocrystalline substrate. In this technique, semiconducting regions are formed on the substrate. The segments of the MESFETS are formed in the semiconducting regions, and are defined by a photolithographic technique. In addition, the source, drain, signal gate, and activating gate electrodes of the segments are formed on the monocrystalline substrate, and are defined by a photolithographic technique. In addition, the connections between the source, drain and gate electrodes of each segment of each MESFET and the source, output, input, and control gate terminals of each MESFET are formed on the monocrystalline substrate and are defined by a photolithographic technique.

The technique permits the segmented dual gate MESFETS and the passive components required for signal coupling and filtering to be formed on the substrate in a very compact, electrically efficient arrangement which minimizes the reactance of segment interconnections, reduces deleterious parasitics and facilitates broadband MESFET operation, leading to broadband phase shifter operation, limited primarily to the bandwidth of the associated phase splitter.

At gigahertz frequency ranges, the phase splitter may take either the form of a pair of complementary RC networks or a ¼ wave directional coupler carried out as a twin transmission line.

BRIEF DESCRIPTION OF THE DRAWINGS

The novel and distinctive features of the invention are set forth in the claims. The invention itself, however, together with further objects and advantages may best be understood by reference to the following description and accompanying drawings in which:

FIGS. 5A and 5B are respectively plan views of the monolithically integrated circuit illustrated in FIG. 4.

DESCRIPTION OF THE PREFERRED EMBODIMENT

Figure 1:
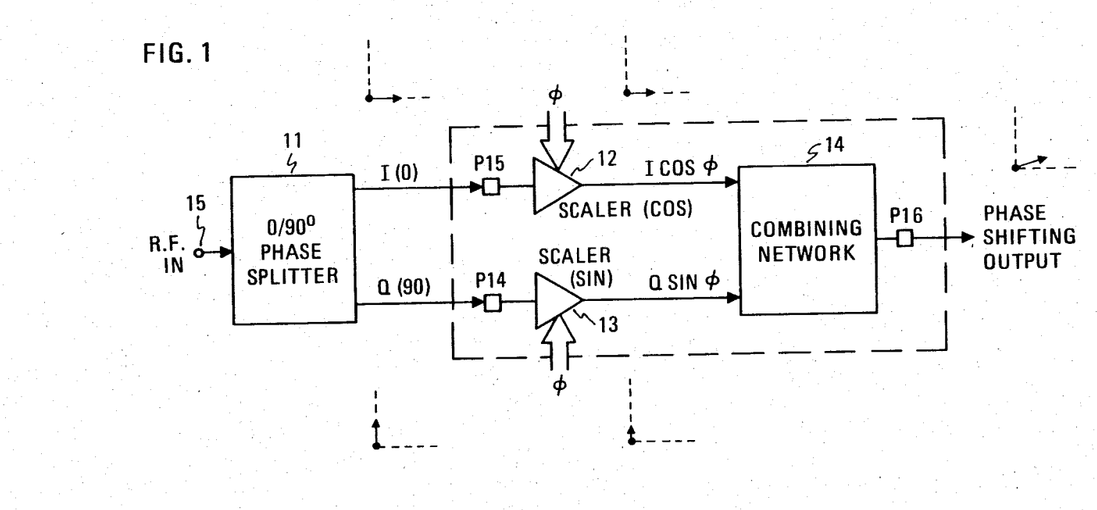
FIG. 1 is a simplified, four element block diagram of a novel digitally controlled phase shifter for use from VHF to EHF frequencies.

The digitally controlled wideband phase shifter, which is the subject of the present invention, has the general configuration shown in the block diagram of FIG. 1. The phase shifter may be seen to consist of four elements—a phase splitter (11) to which the input signal to be phase shifted is applied, and which resolves the signal into two components, a first and a second segmented dual gate MESFET (12 and 13), represented in the diagram as amplifiers, to the signal inputs of which the signal components are applied and to the control inputs of which, control signals (expressive of a trigonometric function of an angle theta) are applied, and a combining network (14) in which the two amplifier outputs are combined to form an output signal which is a reconstruction of the input signal, phase shifted by the angle theta. The phase shifter of FIG. 1 may be formed in one or two integrated assemblies. In the case of the two part assembly, the elements 12, 13, and 14 may be monolithically integrated on a single substrate as indicated by the dotted rectangular outline surrounding these elements and the use of square connection pads to denote the pads for external connection.

Operation of the phase shifter may be restated in somewhat greater detail. The radio frequency signal to be phase shifted is applied to the RF input terminal 15 of the phase shifter for application to the phase splitter 11. The phase splitter 11 may take several forms of which two examples are provided in FIGS. 3A and 3B. The phase splitter splits the input signal into two orthogonally related component vectors (I and Q). The relationship between components is often expressed as being "in quadrature", the letter "I" denoting the in phase component at zero or reference phase and the letter "Q" denoting the component in quadrature phase, 90° from zero or reference phase.

The I and Q components obtained from the phase splitter 11 are coupled respectively to a first and second dual gate MESFET 12 and 13 for scaling in accordance with cosine and sine values respectively of an angle theta equal to the stepped angle of rotation. The MESFET 12 is designed to provide a signal transfer function, which in response to a control signal applied in bit parallel, is proportional to the cosine function of the angle theta. The angle theta is stepped at regular increments typically of 11¼ or 22½ degrees. These angles are simple fractions of 360° (360°/n) where n=$2^k$, k being greater than 2, and the angles take on values from 0° to 90° inclusive. Similarly, the MESFET 13 is designed to provide an AC signal transfer function which in response to the control signal applied in bit parallel is proportional to the sine function of the same angle theta characterized above.

The MESFETS 12 and 13, as will be explained, are active devices which may be adjusted to exhibit stepped attenuation, stepped gain, or stepped attenuation transitioning to gain. The "transfer function" of the two MESFETS is one of the above, and is normalized to a common value representing unity. Since the operation of the segmented MESFETS is best represented as amplifiers having stepped transconductances, the input quantities to these devices are characterized as (AC) voltages and the output quantities characterized as (AC) currents. Accordingly, the output of the MESFET 12 is an AC current vector at reference phase equal to the multiplication of the I vector at reference phase by a scaler quantity equal to the cosine of the angle theta. Similarly the output of the MESFET 13 is a vector at quadrature phase equal to the multiplication of the Q vector at quadrature phase by a scaler quantity equal to the sine of the angle theta.

The outputs of the two MESFETS 12 and 13 are then combined in the combining network 14 to form a vector resultant representing the vector resultant of the input signal rotated by the angle theta, plus a constant insertion phase.

The vector resultant of the output signal is formed in the combining network 14 and appears at the output terminal P16. As noted earlier, the MESFET output quantities are AC currents, and their addition straightforward since they are of the same frequency. The common load should be of relatively low impedance (i.e. 50 ohm), so that a direct interconnection of the drains of the MESFETS 12 and 13 will perform the current addition function.

Figure 4:
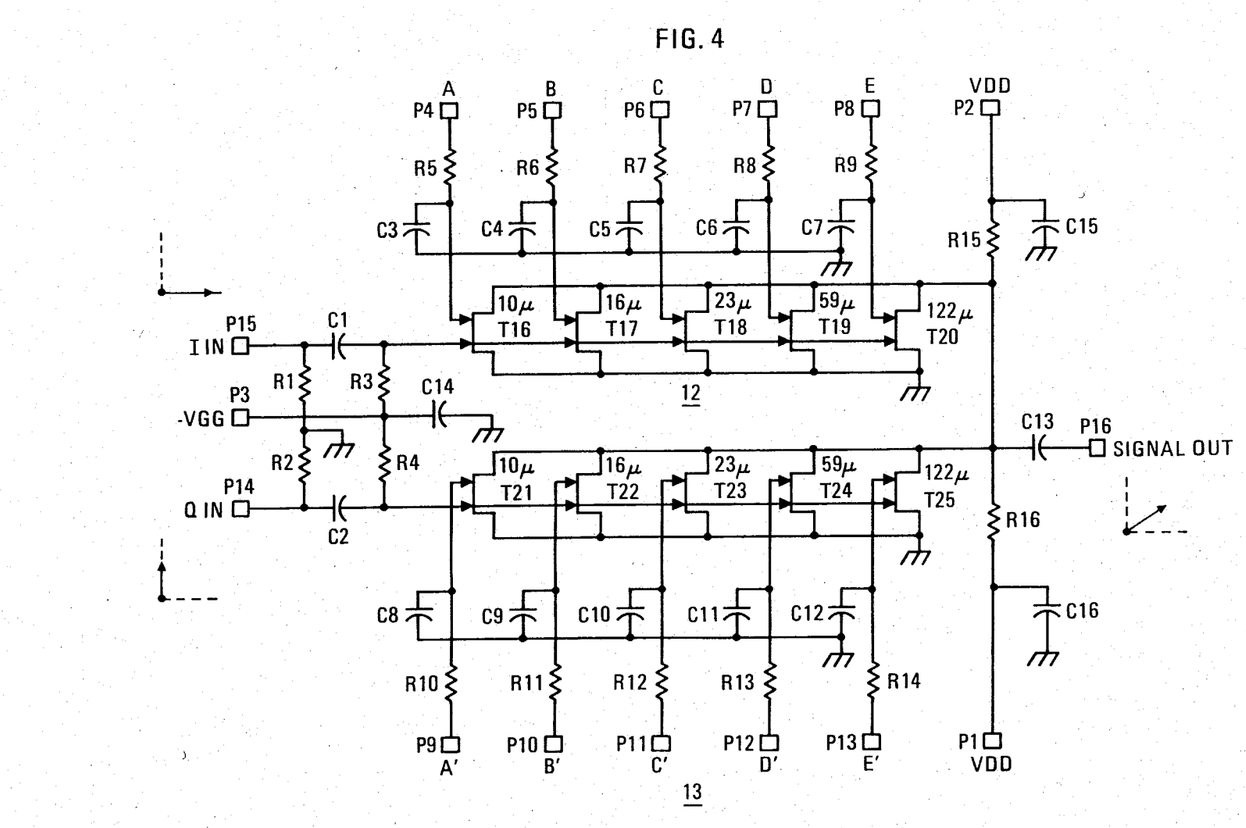
FIG. 4 is an electrical circuit representation of a monolithically integrated circuit for use in a phase shifter for signals from VHF to EHF frequencies and incorporating a pair of segmented dual gate MESFETS to which a pair of quadrature related vector components may be applied to obtain a vector resultant digitally rotated in response to a control signal.
Figure 5A:
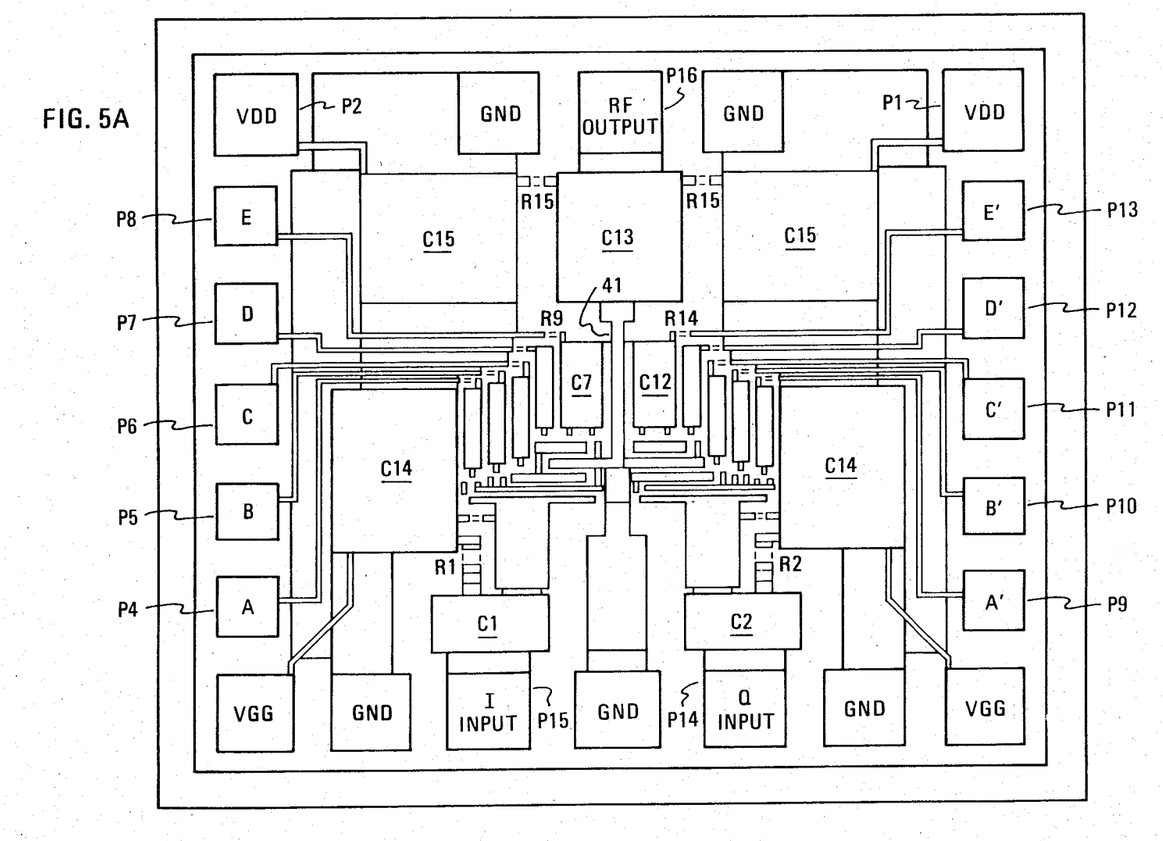
FIG. 5A being a view of the complete monolithically integrated circuit and FIG. 5B being a more detailed plan view of a smaller portion of the monolithically integrated circuit confined primarily to a single segmented dual gate MESFET and portions of the passive components coupled to that MESFET.
Figure 5B:
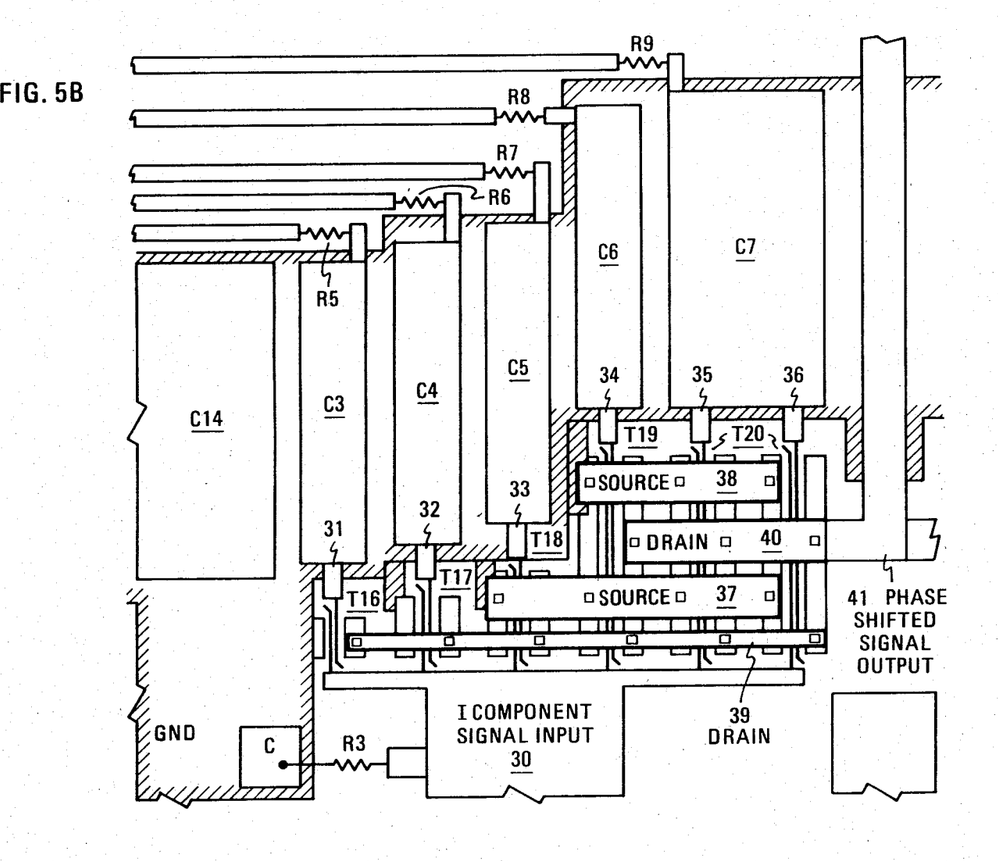

A more detailed illustration of the digitally controlled phase shifter is provided in FIGS. 4, 5A and 5B. The arrangement illustrated in these figures is designed to provide a stepwise count of relative transconductance values to implement sines and cosines of an angle theta required to scale the individual vector components and produce a stepped rotation of the resultant vector at $11\frac{1}{4}°$ intervals between 0° and 90°.

Due to the complementary nature of the sine and cosine functions, and the symmetric selection of the angular intervals, the sine and cosine are implemented by devices of identical design to insure identical unity vectors in the two branches. The scaling values are selected from a restricted set common to the sine and cosine functions but are selected in a sine or cosine sequence by programming the control signal. More particularly, the sine for the angle theta is equal to the cosine of 90° minus theta. If theta takes values which are multiples of $\frac{1}{4}$ or of $\frac{1}{8}$ of 90°, both the cosine and the sine will be taken from the same restricted set of values. Accordingly, a five segment MESFET is appropriate for $11\frac{1}{4}°$ intervals in the event that an approximation of less than 8/10 of a percent is adequate.

The segments, as will now be described, are selectively activated and their selective activation may be under a five bit control signal applied to each of the five segments. The precise dimensions of the segments may be calculated assuming that segment transconductance is proportional to the segment width. For $11\frac{1}{4}°$ intervals the segment proportions are

1:1.45535:2.14035:5.25838:10.95002.

In the event that $22\frac{1}{2}°$ intervals are satisfactory, a three segment MESFET is appropriate if an error of less than half a percent is acceptable. These proportions are 1:3.613:7.524 and the devices may be controlled by a three bit signal. In practice, the five bit design entails segments which are respectively 10, 16, 23, 59 and 122 microns.

Figure 2A:
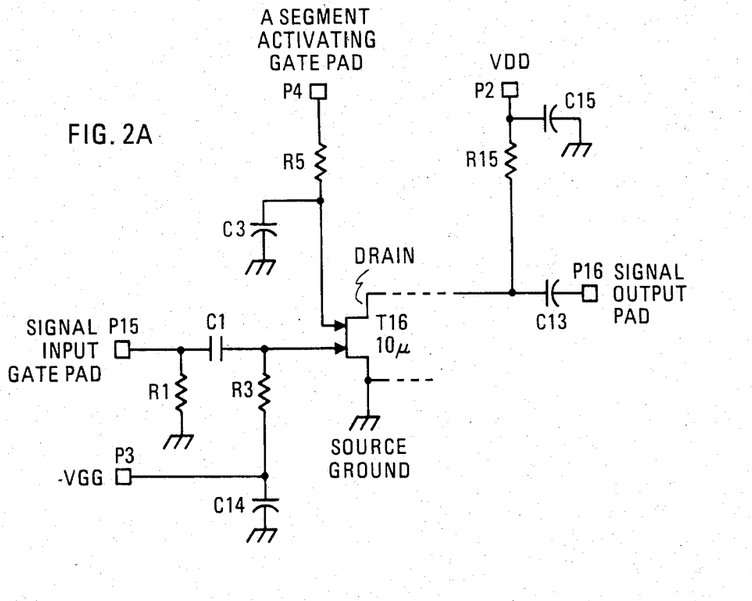
FIGS. 2A and 2B are respectively a simplified electrical circuit diagram and a plan view of a single segment of a segmented dual gate MESFET, explanatory of MESFET operation in scaling individual vector components.
Figure 2B:
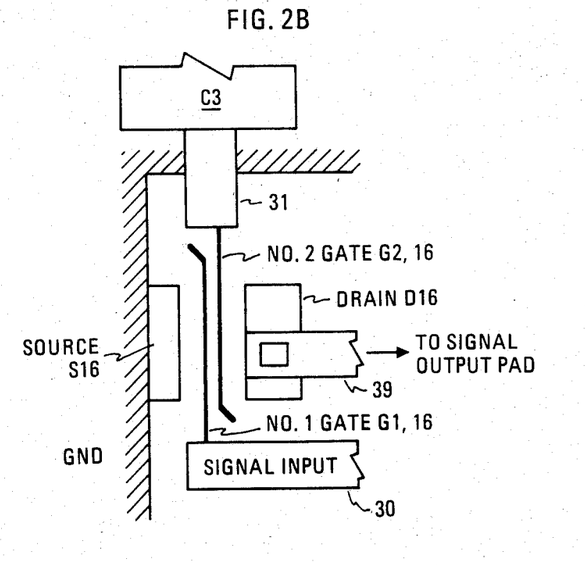

An electrical circuit and a layout of a single segment of a segmented dual gate MESFET are shown in FIGS. 2A and 2B respectively. The circuit components all bear reference numerals consistent with the assumption that the segment depicted in FIGS. 2A and 2B is the first segment of one of the five segment MESFETS shown in FIGS. 4 and 5A and is in fact the MESFET shown in FIG. 5B.

Referring now to FIG. 2A, a single segment of a segmented MESFET is shown at T16. The drawing is legended to indicate that the dimension of the segment is 10 microns. This implies that the width of gate region is 10 microns and that the widths of the other electrodes are all substantially equal and consistent with this width selection for purposes of achieving a predetermined transconductance value.

The MESFET segment T16 may be seen in FIG. 2A to consist of a source and a drain represented respectively as a first and a second horizontal line connecting two vertical lines. The source is represented by the lowermost horizontal line connected to the vertical line extending downward to a ground connection. The drain is represented by the uppermost horizontal line connected to the upward extending vertical line. The gate region is represented by the vertical line extending between the horizontal lines. The drain of T16 (and all other segments of MESFETS 12 and 13) is connected via capacitor C13 to the signal output pad P16 and (in common with all other segments of MESFET 12) via resistor R15, which is bypassed to ground by capacitor C15, to the pad P2 for connection to a source of drain potentials VDD. The segment T16 is provided with a first gate represented by an arrow impinging on the vertical line representing the gate region in closest proximity to the source. The first gate is the signal gate and it is coupled via capacitor C1 to the signal input gate pad P15. A second gate for activating the segment is represented by an arrow impinging on the vertical line representing the gate region between the signal gate and the drain. It is shown coupled via a filter R5, C3 to the segment activating gate pad P4.

The above described MESFET segment is designed to transform the AC input signal voltage appearing at the number one signal gate via the transconductance of that MESFET segment to an output AC signal current flowing through the drain and load resistance R15. The presence of an activating potential on the number two gate allows the transformation of the input signal voltage to an output signal current by allowing the segment to enter the linear active region with higher transconductance saturation current. If on the other hand, the voltage applied to the activating gate is such as to cause cutoff of the MESFET segment, then no transconductance is evident and no output signal current flows in the drain or load resistance. The MESFET segment is operated between signal cutoff where saturation current is substantially extinguished and the high linear current region (where small increments of voltage on the activating gate electrode produce relatively insubstantial changes in transconductance).

The MESFET segment illustrated in circuit form in FIG. 2A is also illustrated in plan view in FIG. 2B. In FIG. 2B, the external circuit components have been omitted and only the immediate metallizations connected to the MESFET electrodes are shown. The source electrode is shown as a rectangular metallization S16 to the left in the drawing in contact with the ground plane. The drain electrode is a rectangular metallization D16 to the right in the drawing and of similar shape to the source. An air bridge connected at the lower part of D16 and extending to the right where it connects to other drain electrodes of MESFET 12, and which leads via several other intermediate metallizations to C13 and the signal output pad P16. The number one signal gate is shown as a vertically extending line-like metallization G1,16 disposed between source and drain but in closer proximity to the source. It is shown connected to a metallization 30 arranged below it and extending to the right where it interconnects the signal gates of all five segments of MESFET 12, and extends downwards for connection to the pad P15 which supplies the I component input signal to the MESFET 12.

The number 2 gate or activating gate (G2,16) is the second vertically extending line-like metallization disposed between source and drain, but in closer proximity to the drain. The activating gate is shown leading to an upward extending conductor 31 insulated from the ground plane and leading toward the capacitor C3.

As the layout of FIG. 2B illustrates, the active regions of all four electrodes (source, number 1 gate, number 2 gate, and drain) of T16 are co-extensive with the width of the gate region and in the T16 example are equal to 10 microns. Assuming that the transconductance is proportional to the gate width, the T16 segment, when activated, provides an increase in transconductance and output current in proportion to this 10 microns gate width. The other segments, of MESFET 12, all larger, will produce greater increments in transconductance and in output signal current.

Figure 3A:
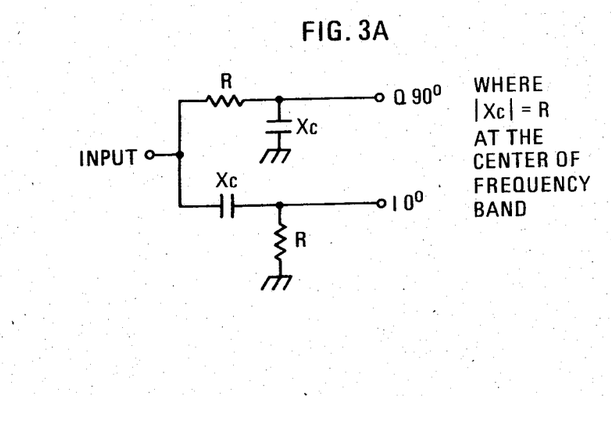
FIGS. 3A, and 3B illustrate two varieties of "phase splitters" suitable for use over portions of the frequency spectrum.
Figure 3B:
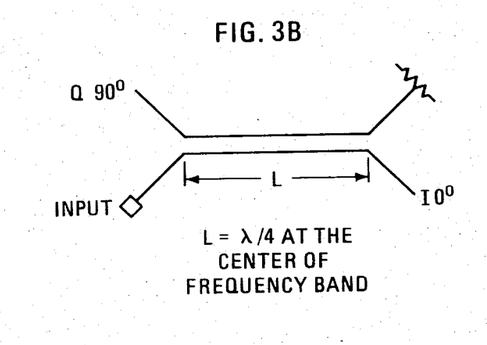

The phase splitter forming the initial block in the phase shifter may take one of several forms. The two varieties illustrated in FIGS. 3A and 3B are suitable for use over portions of the UHF-EHF frequency spectrum in which the segmented gate is an efficient scaler. In general, the scaling function provided by the MESFET is a broadband property, extending to quite low frequencies and upward to frequencies where differential path lengths and parasitic inductances and capacitances disturb phase coherence beyond the system tolerance. The phase splitter on the other hand, is normally limited to narrower portions of the frequency spectrum usually small portions of an octave.

The phase splitter illustrated in FIG. 3A is a network which has a single input for the AC signal and which produces two signal outputs. One output, which is denominated the "I" output channel, provides an output signal at zero or reference phase. The other output, the "Q" output channel, provides a signal in quadrature to the "I" output signal. Ordinarily the phase relation of the "I" signal to the input signal is not fixed, but at the center of the band is typically 45°. The "I" branch of the circuit, consists of a capacitor in the series path between the input and output terminals and a resistance connected in shunt between the output terminal and ground. The "Q" branch of circuit consists of a resistance in the series path between the input and output terminals and a capacitor connected in shunt between the output terminal and ground.

The FIG. 3A circuit is designed for use over a given band of frequencies and is optimum at the design center of the band. The circuit produces the ideal orthogonal relationship when the magnitude of the capacitive reactances (which are both equal to each other) are equal to the resistances (which are both equal to each other). The bandwidth of this arrangement, assuming a tolerance of 5°, is approximately 20% of the bandwidth.

The resistances and capacitances required to provide the phase shift are relatively small at the higher frequencies and are suited to integration on a substrate common to the segmented dual gate MESFETS, to form a complete phase shifter. At gigahertz frequencies the chip area required for the capacitors are comparable to the chip area required for the MESFETS illustrated in FIG. 5A.

At the upper end of the frequency spectrum (at gigahertz frequencies) the arrangement illustrated in FIG. 3B is also appropriate and may also be monolithically integrated with the MESFET scalers at frequencies above 5 gigaherz. The design of FIG. 3B may be called a "3 db quadrature directional coupler", which is a four terminal device consisting of a two coupled transmission lines of quarter wave length. The signal input is coupled to the lower left terminal of the lower conductor, and the "I" component is derived from the right terminal of the lower conductor. The quadrature phase component appears at the upper left terminal of the upper conductor with the right end being connected to a matched resistive load.

As in the case of the FIG. 3A embodiment, the circuit of FIG. 3B is of narrower bandwidth than the scaler, and also of narrower bandwidth than the FIG. 3A arrangement. The FIG. 3B arrangement performs best at the exact frequency at which the coupled transmission lines exhibit an exact length of quarter wave length. The useful band of operation of the FIG. 3B embodiment, is ordinarily 10 to 15% of the center frequency, although more elaborate directional couplers can extend the bandwidth to 50% and higher.

An integrated circuit suitable for VHF to EHF operation and designed to be combined with one of the splitters illustrated in FIGS. 3A and 3B in performing a stepped one quadrant, phase shift is illustrated in FIGS. 4, 5A and 5B.

The integrated circuit consists of an input circuit (C1, C2, C14, R1-R4) designed to accept the "I" and "Q" vector components from the phase splitter 11, and two five segment scalers 12, 13 and a combining network 14. The combining network 14 consists of a common connection of the drains of MESFETS 12, 13 to equal load (R15, R16 leading to a common output via capacitor C13 to pad P16)). The loads R15, R16 are connected between the drains of 12, 13 and a common source of drain potentials (VDD). The drains are thus connected together at one terminal of the common coupling capacitor C13, which leads to the RF output pad P16, at which the phase shifted output signal appears.

As is shown in the left portion of the circuit diagram of FIG. 4, each segment of the I channel dual gate MESFET 12 is similar except for width to the segment T16 already discussed in connection with FIGS. 2A and 2B and they are paralleled to contribute to the total signal output current. In particular, the sources of the segments T16-T20 are connected together and returned to the substrate ground. The number 1 signal gates of the devices T16-T20 are connected together and provided with an I signal from the pad P15 via the input network. The input network of the I channel consists of a shunt resistance R1 connected between P15 and ground, a series capacitor C1 and a biasing network (partially shared with the MESFET 13) consisting of the resistance R3 connected between the number 1 gates and the pad P3 to which the signal gate bias −Vgg is applied. The pad P13 is bypassed to ground by the capacitor C14.

Continuing with the I channel circuit of FIG. 4, the activating gates of the segments T16-T20, are separately bypassed to ground by the respective capacitors C3 to C7 and serially connected via the respective resistances R5 to R9 to the respective pads P4 thru P8 for application of individual activating potentials. The drains of the segments T16-T20 are connected together and via load resistance R15 (as earlier noted) to the pad P2 for application of VDD potentials. The pad P2 is bypassed by capacitor C15 to ground. The drain of the I channel MESFET 12 is further connected to one terminal of the capacitor C1 for coupling to the signal output pad P16 for derivation of the signal output.

The Q channel is similar to the I channel and consists of a dual gate MESFET consisting of the segments T21-T25. As before, the sources of the segments T21-T25 are connected together and returned to the substrate ground. The number 1 signal gates of the devices T21-T25 are connected together and provided with a Q signal from pad P14 via the input network. The input network of the Q channel consists of a shunt resistance R2 connected between pad P14 and ground, a series capacitor C2, and a biasing network (partially shared with the MESFET 12) consisting of the resistance R4 connected between the number 1 gates and the pad P3.

Continuing with the Q channel circuit of FIG. 4, the activating gates of the segments T21-T25, are separately bypassed to ground via the respective capacitors C8 to C12, and serially connected via the respective resistances R10-R14 to the respective pads P9-P13 for application of individual activating potentials. The drains of the segments T21-T25 are connected together and via a load resistance R16 to the pad P1 for application of VDD potentials. The pad P1 is bypassed by capacitor C16 to ground. The drain of the Q channel MESFET is further connected to one terminal of the capacitor C1 for coupling to the signal output pad P16.

The combining network 14, which adds the signal currents of the separate MESFETS consists merely of the connection of the drains of MESFET 12 and MESFET 13, which have equal load resistances (R15=R16) to one terminal of capacitor C13 for coupling the signal to the signal output pad P16.

As earlier discussed, the MESFETS 12 and 13 are of similar design having segment widths of 10, 16, 23, 59 and 122 microns respectively for scaling individual vector components to achieve consecutive 11¼° steps in a single quadrant of angular rotation of the resultant vector. The layouts provided in FIGS. 5A and 5B illustrate respectively the full integrated circuit of which the MESFETS 12 and 13 are parts, and a smaller portion of the integrated circuit illustrating primarily the MESFET 12 in the I channel.

The layout of the individual segments of one dual gate MESFET can best be understood from a consideration of FIG. 5B which deals primarily with MESFET 12. In particular, the segments T16-T20 of MESFET 12 are arranged with the lowest numbered segment to the left and the highest numbered segment to the right. In each case the gate length is measured along the horizontal dimension of the drawing and the gate width is measured along the vertical dimension of the drawing. While the gate lengths of all segments are alike, the gate widths are scaled by the numbers noted above. In each segment, the source is to the left and the drain is to the right. The signal gates for all the MESFETS T16-T20 is the line-like electrode (of two line-like electrodes) to the left and all signal gates are connected to the metallization 30 arranged below them which supplies the I component input signal.

The activating gates are individually supplied from downwardly extending metallizations (31; 32; 33; 34; and 35-36 (shared)) associated with the respective capacitors C3, C4, C5, C6 and C7. These activating metallizations lead via the resistances R5-R9 (which are shown in FIG. 5B) to which the pads P4-P8 (shown only in FIG. 5A) on the left side of the integrated circuit. The source connections to ground are directly made for the segments T16, T17, and T18, the source of T18 however forming the point of contact for an air bridge connector 37 grounding the lower part of the source of T19 and of both sections of source T20. The second air bridge connector 38 supplements conductor 37 grounding the upper parts of the source of T19 and of both sections of source T20. The drains of all the devices T16-T20 are connected via an air bridge connector 39 which is supplemented by a further air bridge 40, both of which connect the respective drains of MESFET 12 to a consolidated drain metallization 41. As illustrated in FIG. 4A, the consolidated drain metallization connects the drains of both MESFETS 12 and 13 via capacitor C13 to the RF output pad P16.

Figure 6A:
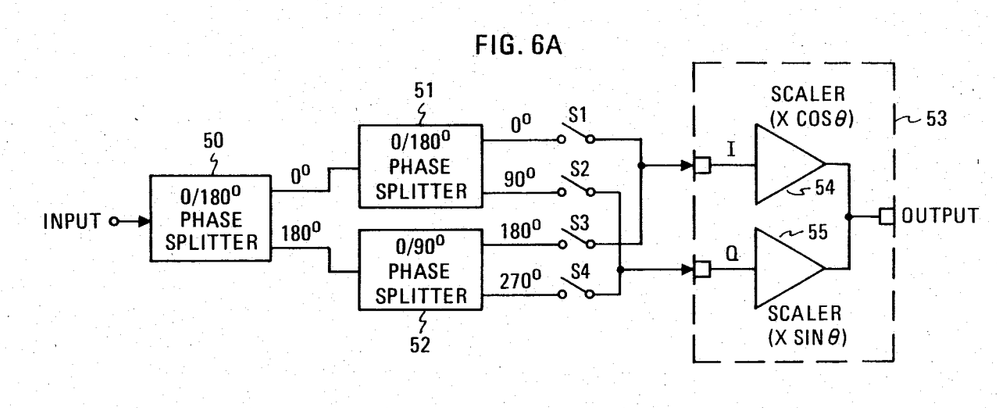
FIGS. 6A and 6B illustrate two arrangements for producing a full 360° of digitally stepped phase rotation.

One phase shifting arrangement suitable for producing a full 360° of digitally stepped phase rotation is illustrated in FIG. 6A. The arrangement is depicted in simplified block diagram form, it being understood that the phase splitters switches and the scalers may have differing practical designs depending upon application.

As seen in FIG. 6A, the phase shifter consists of a first (0°, 180°) splitter 50. The phase splitter 50 may take the form of a pair of MESFETS having the signal applied to the gate of the first device, with the gate of the other device being grounded. The sources of the two devices are connected together to a common load providing signal coupling from the first to the second device. The drains of the two devices are connected to a common source of drain potentials via two separate but equal load resistances. The complementary 0°, 180° phases appear at the first and second drains respectively.

The 0° output from the phase splitter 50 is connected to a (0°, 90°) phase splitter 51 having two outputs, one at zero or reference phase and the other in quadrature (90°) to the reference phase. The 180° output from phase splitter 50 is fed to a second 0°, 90° phase splitter 52, similar to phase splitter 52. At the zero output the phase splitter 52 produces an output of 180° and in the 90° output, the phase splitter 52 produces an output of 270°.

The four outputs of the phase splitters 51 and 52 are selectively connected by means of the switches S1 to S4 to the I and Q inputs of a pair of scalers such as are shown in FIGS. 4, 5A and 5B. The switches S1 to S4 are preferably MESFET switches subject to electronic control similar to that used to activate the individual segments. Either the zero phase output of the phase splitter 51 is connected via the switch S2 to the Q input of the integrated circuit 53, or the 180° output of the phase splitter 52 is connected via the switch S3 to the I input of the integrated circuit 53. Similarly, either the 90° output of the phase splitter 51 is connected via the switch S2 to the Q input of the integrated circuit 53 or the 270° output of the phase splitter 52 is connected via the switch S4 to the Q input of the integrated circuit 53.

In the first quadrant, switches S1 and S2 are closed (S3 and S4 are open) and the 0°, 90° outputs from 51 are coupled respectively to the I and Q input pads of the integrated circuits 53. This is consistent with the assumption that in the first quadrant both the sine and the cosine are positive. In the second quadrant, where the sine remains positive and the cosine becomes negative, the switch S2 remains closed (S4 being open) and S1 is now opened while S3 is closed to invert the sign of the cosine component. In the third quadrant where both sine and cosine are negative, both switches S1 and S2 are open and both switches S3 and S4 are closed. Finally, in the fourth quadrant where the sine remains negative and the cosine is positive, the switch S1 is closed (S3 is open) and S4 is closed (S2 is open).

Figure 6B:
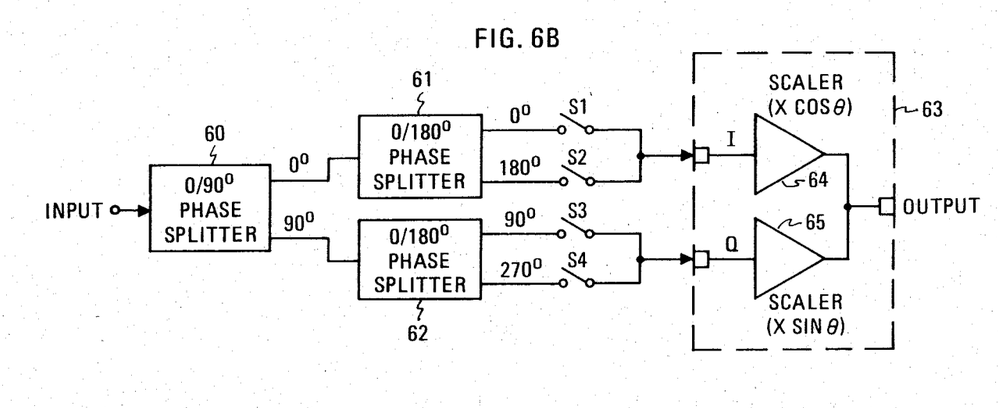

A second phase shifting arrangement suitable for producing a full 360° of digitally stepped phase rotation is illustrated in FIG. 6B. The arrangement is similar to that illustrated in FIG. 6A in that it is a five element four switch arrangement and differs in that 0°, 90° phase splitters are interchanged with 0°, 180° phase splitters and vice versa. Thus, the combination illustrated in FIG. 6B consists of an initial 0°, 90° phase splitter 60 whose two outputs are connected respectively to a first 0°, 180° phase splitter 61 and to a second 0°, 180° phase splitter 62. The four outputs of the two last recited phase splitters define components at each of the four quadrant boundries and a series of switches S1 to S4 operating in the same manner as described with respect to FIG. 6A change the phase of the signal applied to the I and Q input pads of the integrated circuit 63 to effect full 360° phase rotation.

As previously stated, the phase shifter herein described makes use of the extraordinary characteristics of a method of circuit fabrication currently known as "MMIC" (monolithic microwave integrated circuit) technology. In current usage, the term "MMIC" implies a circuit fabrication technique in which active and passive components are formed by a photolithographic process on an insulating substrate having both electrically active regions, in which transistors may be formed, and electrically passive regions, in which conductive runs, transmission lines, inductors, capacitors and resistors may be formed. The fabrication technique, except for external connections to the pads made at the perimeter of the MMIC component, is throughout a photolithographic process controlled by large scale masks which may be generated by computer aided methods and which lend themselves to an automated mode of fabrication.

The word "monolithic" in the term "MMIC" implies the use of a single crystal, insulating, semi-insulating or semiconductor substrate upon which passive and active circuit elements are fabricated and interconnected in accordance with one of several competing semiconductor technologies. At higher frequencies, the substrate material currently preferred for the semiconducting properties is gallium arsenide which has a high carrier (electron) mobility. In addition, gallium arsenide, classified as a semi-insulator is available with the high bulk resistivity required to support low loss transmission lines and low loss conductive paths and which provides good isolation between components. Gallium arsenide has a high dielectric constant (13.0) which is a factor, not always beneficial, influencing the transmission path design.

The word "microwave" in the term "MMIC" generally expresses the frequencies at which integrated circuits incorporating this technology are functional. Commonly the word implies circuit functionality at frequencies of 300 megahertz to 300,000 megahertz (Webster's New World Dictionary, p. 898). While some definitions may recognize no upper limit (e.g. "from about 1000 megahertz upwards" IEEE Standard Dictionary of Electronic and Electrical Terms, 3rd Edition, 1984), the word is also used to imply suitability for applications at much lower operating frequencies where high frequency response (at microwave frequencies) can improve circuit performance.

Functionality of an integrated circuit over the "microwave" portion of the radio frequency spectrum requires both good transistors in the active regions of the substrate as well as good passive devices and good point to point connections in the passive regions. In respect to the latter, the microwave transmission paths should be of reasonable efficiency and the conductive runs should be of low loss and good crossover techniques essential to any general circuit strategy such as "air bridges" should be present.

The term "integrated circuit" in the term "MMIC" implies that circuit components are formed integrally with the substrate by the phototithographic techniques discussed earlier, and that the circuit comprises pluralities of interconnected components, at least some of which are active.

MMIC technology is to be distinguished from "hybrid" monolithic integrated circuit technology. The dimensions of MMIC components, whether passive or active, are orders of magnitude smaller than lumped discrete components characteristic of the "hybrid" monolithic integrated circuit technology. In hybrid MIC technology, IC chips, transistor chips, capacitors, and resistors, etc. are treated as discrete components to be interconnected by wire bonds or similar non photolithographic techniques. Wire bond interconnections pose both the problem of creating electrical discontinuities at high frequencies by unwanted parasitic reactances and of introducing a variability in electrical characterization not present in a photolithographically defined interconnection technique.

The smaller dimensions characteristic of MMIC technology often reduces the phase delays in conductive paths and transmission lines to near negligibility. For instance, a differential signal path length of 200 microns, reasonable for the MESFET devices herein described, corresponds to a phase aberration of less than 2° at 10 gigahertz, where 10° would be tolerable. The smaller sizes and shorter distances between components characteristic of MMIC technology also reduce the parasitic capacitances and inductances within the active devices and in the interconnections between passive and active devices. These factors permit operation at frequencies as high as C-band (5–6 gigahertz) and often beyond with little difficulty.

Finally, both passive and active components can be matched with precision more economically with MMIC technology than with discrete technology. Large area metallizations, such as are used for capacitor plates or high current transmission lines are of course, highly accurate in an absolute sense. While absolute values may be somewhat more variable in small area devices, "tracking" or "matching" is often present. The symmetry attributable to common design rules in computer assisted layouts used in forming comparable devices contributes to this high degree of matching. In addition, the technology, which uses methods such as mask defined conductor runs and air bridges provides accuracy in conductor layouts with a repeatability which is not present in any other process.

In practical terms, MMIC technology has made possible the fabrication of the phase shifter herein described which is functional at frequencies as high as 5 gigahertz. In the embodiment of the phase shifter illustrated, multiple active MESFET segments cooperate as parts of a unitary active MESFET with accurately formed resistive and capacitive elements and with efficient signal paths in close association with the MESFET to achieve a high frequency performance that cannot be matched by the discrete MIC technology.

What is claimed is:

1. A digitally controlled wideband phase shifter, which is adjustable in selected discrete angular steps, comprising
   A. an input terminal for application of an AC input signal;
   B. phase splitting means coupled to said input terminal for resolving said input signal into a first and a second vector component in mutual quadrature, and including a first and a second output terminal for supplying said first and second components respectively;
   C. a first and a second dual gate MESFET, each MESFET having a source terminal, a drain terminal, a signal gate terminal and n-fold control terminals, and being subdivided into an n-fold plurality of selectively activated MESFET segments, each segment having a predetermined width to achieve a desired transconductance, and including (1) an electroded source region connected to said MESFET source terminal (2) an electroded drain region connected to said MESFET drain terminal, and (3) a gate region defined between said source and drain regions having (i) a signal gate electrode disposed between said source and an activating gate electrode, electrically connected to said MESFET signal gate terminal for modifying the AC output signal current of said MESFET as a function of the segment transconductance, and (ii) an activating gate electrode disposed between said signal gate electrode and said drain for turning current flow "ON" or "OFF" in said MESFET segment and electrically connected to one of said control terminals, said first and second of said quadrature related vector components being applied to the signal gate terminals of said first and second MESFETS respectively, said segments of said first MESFET being proportioned and ordered for connection to an electrical control signal coupled to the n-fold control terminals of said first MESFET such that successive combinations of active segments provide successive transfer values proportional to successive values of the sine function of an angle theta said segments of said second MESFET being proportioned and ordered for connection to an electrical control signal coupled to the n-fold control terminals of said second MESFET such that successive combinations of activated segments provide successive transfer values proportional to successive values of the cosine function of said angle theta; and D. means for combining the quadrature related vector components at the outputs of said first and second MESFETS respectively proportioned to said sine and cosine values of said angle theta to form an output signal the phase of whose vector resultant represents a stepped rotation by said angle theta of the vector resultant of the input signal.

2. A digitally controlled wideband phase shifter as set forth in claim 1 wherein said angle theta is defined to have values between 0° and 90° inclusive, and equalling successive multiples of a given nth part of 360° where n=$2^k$; k being greater than 2, whereby the segmental design of each MESFET permits each MESFET to generate both sine and cosine values for the angle theta and permits the two MESFETS to have the same segmental design.

3. A digitally controlled wideband phase shifter as set forth in claim 2 wherein said quantity k is equal to 3, the angle theta having values equal to multiples of $22\frac{1}{2}°$.

4. A digitally controlled wideband phase shifter as set forth in claim 3 wherein said segmental widths are in the proportions of 1:3.613:7.524 to approximate the sine and cosine of multiples $22\frac{1}{2}°$ in response to a three bit control signal.

5. A digitally controlled wideband phase shifter as set forth in claim 2 wherein said quantity k is equal to 5, the angle theta having values equal to multiples of $11\frac{1}{4}°$.

6. A digitally controlled wideband phase shifter as set forth in claim 2 wherein said segments are in proportions of 10, 16, 23, 57, and 122 to approximate the sine and cosine of multiples of $11\frac{1}{4}°$ in the proportions of 0, 39, 75, 108, 138, 161, 181, 191, and 197 in response to a five bit control signal.

7. A digitally controlled wideband phase shifter as set forth in claim 1 wherein each of said MESFETS is integrated on a monocrystalline substrate having semiconducting regions, the segments of said MESFETS being formed in said semiconducting regions and being defined by a photolithographic technique, and wherein the electroding of said source, drain, signal gate, and activating gate electrodes of said segments are formed on said monocrystalline substrate, and are defined by a photolithographic technique.

8. A digitally controlled wideband phase shifter as set forth in claim 7 wherein both of said MESFETS are integrated on a single said monocrystalline substrate.

9. A digitally controlled wideband phase shifter as set forth in claim 8 wherein the connections tetween the source, drain and gate electrodes of each segment of each MESFET and said source output, input, and control gate terminals of each MESFET are formed on said monocrystalline substrate and are defined by a photolithographic technique.

10. A digitally controlled wideband phase shifter as set forth in claim 9 wherein said monocrystalline substrate is semi-insulating having a resistivity sufficiently high to provide low ohmic losses to conductors supported thereon, said connections to said terminals being formed primarily on said semi-insulating regions.

11. A digitally controlled wideband phase shifter as set forth in claim 10 wherein said monocrystalline substrate is of gallium arsenide.

12. A digitally controlled wideband phase shifter as set forth in claim 1 wherein first and second MESFETS are integrated on a single monocrystalline substrate of a semi-insulating monocrystalline material with doped semiconducting regions formed thereon, and wherein said MESFET segments, said segment electroding, and the connections between segment electroding and said terminals are formed on said substrate and defined by a photolithographic process.

13. A monolithically integrated active MESFET as set forth in claim 1 wherein said first and second MESFETS are formed by a monolithic microwave integrated circuit process on a single substrate.

14. A monolithically integrated active MESFET as set forth in claim 1 wherein said first and second MESFETS are integrated on a single substrate, and wherein said MESFET segments, said segment electroding, and the connections between segment electroding and said terminals are formed on said substrate by a photolithographic process in a compact, electrically efficient arrangement to minimize the reactance of segment interconnections, to reduce deleterious parasitics and to facilitate virtual unitary MESFET operation of each MESFET.

15. The digitally controlled wideband phase shifter set forth in claim 1 monolithically integrated on a common substrate wherein, said phase splitting means comprises (1) a first resistance and a first capacitance formed on said substrate and connected respectively in series and in shunt with the signal path from said signal terminal to said first phase splitter output terminal for the provision of said first quadrature component; and (2) a second resistance and a second capacitance formed on said substrate and connected respectively in shunt and in series with the signal path from said signal input terminal to said second phase splitter output terminal; and wherein said first and second dual gate MESFETS are also formed on said substrate.

16. In a digitally controlled wideband phase shifter, which is adjustable in selected discrete angular steps, the combination comprising A. a pair of input terminals for application of an AC input signal resolved into a first and a second vector component in mutual quadrature;

B. a first and a second dual gate MESFET, each MESFET having a source terminal, a drain terminal, a signal gate terminal and n-fold control terminals, and being subdivided into an n-fold plurality of selectively activated MESFET segments, each segment having a predetermined width to achieve a desired transconductance, and including (1) an electroded source region connected to said MESFET source terminal (2) an electroded drain region connected to said MESFET drain terminal, and (3) a gate region defined between said source and drain regions having (i) a signal gate electrode disposed between said source and an activating gate electrode, electrically connected to said MESFET signal gate terminal for modifying the AC output signal current of said MESFET as a function of the segment transconductance, and (ii) an activating gate electrode disposed between said signal gate electrode and said drain for turning current flow "ON" or "OFF" in said MESFET segment and electrically connected to one of said control terminals, said first and second of said quadrature related vector components being applied to the signal gate terminals of said first and second MESFETS respectively, said segments of said first MESFET being proportioned and ordered for connection to an electrical control signal coupled to the n-fold control terminals of said first MESFET such that successive combinations of active segments provide successive transfer values proportional to successive values of the sine function of an angle theta, said segments of said second MESFET being proportioned and ordered for connection to an electrical control signal coupled to the n-fold control terminals of said second MESFET such that successive combinations of activated segments provide successive transfer values proportional to successive values of the cosine function of said angle theta; and C. means for combining the quadrature related vector components at the outputs of said first and second MESFETS to form an output signal, the phase angle of whose vector resultant represents a stepped rotation by said angle theta of the vector resultant of the input signal.

17. A phase shifter as set forth in claim 16 wherein said quantity k is equal to 3, the angle theta having values equal to multiples of $22\frac{1}{2}°$.

18. The combination set forth in claim 17 wherein said segmental widths are in the proportions of 1:1.2.613:7.524 to approximate the sine and cosine of multiples $22\frac{1}{2}°$ in response to a three bit control signal.

19. The combination set forth in claim 17 wherein said quantity k is equal to 5, the angle theta having values equal to multiples of $11\frac{1}{4}°$.

20. The combination set forth in claim 19 wherein said segments are in proportions of 10, 16, 23, 57, and 122 to approximate the sine and cosine of multiples of $11\frac{1}{4}°$ in the proportions of 0, 39, 75, 108, 138, 161, 181, 191, and 197 in response to a five bit control signal.

21. The combination set forth in claim 16 wherein each of said MESFETS is integrated on a monocrystalline substrate having semiconducting regions, the segments of said MESFETS being formed in said semiconducting regions and being defined by a photolithographic technique, and wherein the electroding of said source, drain, signal gate, and activating gate electrodes of said segments are formed on said monocrystalline substrate, and are defined by a photolithographic technique.

22. The combination set forth in claim 21 wherein both of said MESFETS are integrated on a single said monocrystalline substrate.

23. The combination set forth in claim 22 wherein the connections between the source, drain and gate electrodes of each segment of each MESFET and said source output, input, and control gate terminals of each MESFET are formed on said monocrystalline substrate and are defined by a photolithographic technique.

24. The combination set forth in claim 23 wherein said monocrystalline substrate is semi-insulating having a resistivity sufficiently high to provide low ohmic losses to conductors supported thereon, said connections to said terminals being formed primarily on said semi-insulating regions.

25. The combination set forth in claim 23 wherein said monocrystalline substrate is of gallium arsenide.

26. The combination set forth in claim 16 wherein first and second MESFETS are integrated on a single monocrystalline substrate of a semi-insulating mono crystalline material with doped semiconducting regions formed thereon, and wherein said MESFET segments, said segment electroding, and the connections between segment electroding and said terminals are formed on said substrate and defined by a photolithographic process.

27. The combination set forth in claim 16 wherein
said first and second MESFETS are formed by a monolithic microWave integrated circuit process on a single substrate.

28. The combination set forth in claim 16 wherein
said first and second MESFETS are integrated on a single substrate, and wherein
said MESFET segments, said segment electroding, and the connections between segment electroding and said terminals are formed on said substrate by a photolithographic process in a compact, electrically efficient arrangement to minimize the reactance of segment interconnectsions, to reduce deleterious parasitics and to facilitate virtual unitary MESFET operation.

29. The combination set forth in claim 16 having in addition thereto
phase splitting means, having a first terminal for application of said AC input signal, for resolving said input signal into a first and a second vector component in mutual quadrature and including a first and a second output terminal for supplying said first and second components respectively to said pair of input terminals (A).

30. The combination set forth in claim 29 wherein
said phase splitting means resolves said input signal into quadrature components over a full four quadrants.

31. The combination set forth in claim 30 wherein
said angle theta is defined to have values equalling successive multiples of a given nth part of 360°, where $n=2^k$; k being greater than 2.

* * * * *